(12) United States Patent
del Puerto et al.

(10) Patent No.: US 7,298,459 B2
(45) Date of Patent: *Nov. 20, 2007

(54) WAFER HANDLING METHOD FOR USE IN LITHOGRAPHY PATTERNING

(75) Inventors: Santiago E. del Puerto, Milton, NY (US); Stephen Roux, New Fairfield, CT (US); Justin L. Kreuzer, Trumbull, CT (US)

(73) Assignee: ASML Holding N.V. (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/182,192

(22) Filed: Jul. 15, 2005

(65) Prior Publication Data

US 2005/0264791 A1 Dec. 1, 2005

Related U.S. Application Data

(63) Continuation of application No. 10/896,057, filed on Jul. 22, 2004, now Pat. No. 6,927,842, which is a continuation of application No. 09/981,992, filed on Oct. 19, 2001, now Pat. No. 6,778,258.

(51) Int. Cl.
*G03B 27/32* (2006.01)
*G03B 27/58* (2006.01)

(52) U.S. Cl. .......................... 355/77; 355/72
(58) Field of Classification Search ................. 355/53, 355/72, 75, 77; 430/22
See application file for complete search history.

(56) References Cited

U.S. PATENT DOCUMENTS

| | | | |
|---|---|---|---|
| 5,217,501 A | 6/1993 | Fuse et al. | |
| 5,376,212 A * | 12/1994 | Saiki | 156/345.31 |
| 5,474,641 A | 12/1995 | Otsuki et al. | |
| 5,486,080 A | 1/1996 | Sieradzki | |
| 5,748,827 A | 5/1998 | Holl et al. | |
| 5,958,198 A | 9/1999 | Banholzer et al. | |
| 6,697,145 B1 * | 2/2004 | Aoyama | 355/53 |
| 6,702,865 B1 * | 3/2004 | Ozawa et al. | 29/25.01 |
| 6,778,258 B2 | 8/2004 | del Puerto et al. | |
| 6,927,842 B2 * | 8/2005 | del Puerto et al. | 355/77 |
| 2001/0035942 A1 | 11/2001 | Hara et al. | |
| 2002/0002946 A1 * | 1/2002 | Tanaka et al. | 118/719 |
| 2002/0074635 A1 | 6/2002 | Hattori et al. | |
| 2002/0081175 A1 | 6/2002 | Kawahara et al. | |
| 2002/0092763 A1 * | 7/2002 | Denning et al. | 204/192.17 |
| 2002/0126269 A1 * | 9/2002 | Sato | 355/77 |

(Continued)

FOREIGN PATENT DOCUMENTS

EP 0 506 045 A2 9/1992

(Continued)

OTHER PUBLICATIONS

English Abstract for JP 10-22226 A, 1 page, provided by the European Patent Office.

(Continued)

*Primary Examiner*—Rodney Fuller
(74) *Attorney, Agent, or Firm*—Sterne, Kessler, Goldstein & Fox PLLC

(57) ABSTRACT

A method utilizing a lithography system comprises a lithography patterning chamber, a wafer exchange chamber separated from the lithography patterning chamber by a first gate valve, and at least one alignment load-lock separated from the wafer exchange chamber by a second gate valve. The alignment load-lock includes an alignment stage that aligns a wafer during pump-down. The alignment load-lock can be uni-directional or bi-directional. The lithography system can include one or multiple alignment load-locks.

11 Claims, 8 Drawing Sheets

U.S. PATENT DOCUMENTS

2003/0082466 A1     5/2003    del Puerto et al.
2004/0257554 A1    12/2004    del Puerto et al.
2006/0026857 A1*    2/2006    Kim et al. .................... 34/92

FOREIGN PATENT DOCUMENTS

| JP | 10-22226 A1 | 1/1998 |
| JP | 10-135301 A1 | 5/1998 |
| JP | 2001-35904 A1 | 2/2001 |
| WO | WO 01/40875 A1 | 6/2001 |

OTHER PUBLICATIONS

English Abstract for JP 10-135301 A, 1 page, provided by the European Patent Office.

English Abstract for JP 2001-35904 A, 1 page, provided by the European Patent Office.

European Search Report from European Patent Appl. No. 02023607.1, 4 pages, dated Nov. 4, 2004.

* cited by examiner

WAFER HANDLING METHOD FOR USE IN LITHOGRAPHY PATTERNING

CROSS REFERENCE TO RELATED APPLICATIONS

This application is a continuation of U.S. application Ser. No. 10/896,057, filed Jul. 22, 2004 (now U.S. Pat. 6,927,842 that issued Aug. 9, 2005), which is a continuation of U.S. application Ser. No. 09/981,992 filed Oct. 19, 2001 (now U.S. Pat. No. 6,778,258 that issued Aug. 17, 2004), which are incorporated by reference herein in their entireties.

BACKGROUND OF THE INVENTION

1. Field of the Invention

The present invention relates to a wafer handling system and method for use within a lithography system. More particularly, this invention relates to a system and method of wafer handling in which wafers are transported within a lithography system while being affixed and aligned to chucks, thereby maximizing production throughput.

2. Related Art

Lithography is a process used to create features on the surface of substrates. Such substrates can include those used in the manufacture of flat panel displays, circuit boards, various integrated circuits, and the like. A frequently used substrate for such applications is a semiconductor wafer. While this description is written in terms of a semiconductor wafer for illustrative purposes, one skilled in the art would recognize that this description also applies to other types of substrates known to those skilled in the art. During lithography, a wafer, which is disposed on a wafer stage, is exposed to an image projected onto the surface of the wafer by exposure optics located within a lithography apparatus. While exposure optics are used in the case of photolithography, a different type of exposure apparatus may be used depending on the particular application. For example, x-ray, ion, electron, or photon lithographies each may require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface of the wafer.

Step-and-scan technology works in conjunction with a projection optics system that has a narrow imaging slot. Rather than expose the entire wafer at one time, individual fields are scanned onto the wafer one at a time. This is done by moving the wafer and reticle simultaneously such that the imaging slot is moved across the field during the scan. The wafer stage must then be stepped between field exposures to allow multiple copies of the reticle pattern to be exposed over the wafer surface. In this manner, the sharpness of the image projected onto the wafer is maximized. Through increases in both alignment precision and projection accuracy, today's lithography tools are capable of producing devices with ever decreasing minimum feature size. However, minimum feature size is but one measure of a lithography tool's utility. Another critical measure is throughput.

Throughput refers to the number of wafers per hour that can be patterned by a lithography system. Every task that must be performed on wafers within a lithography system contributes to the total time required to pattern the wafers, with an associated decrease in throughput. One critical task that must be performed repeatedly within a lithography system is wafer alignment. Wafers must be precisely aligned within a lithography system in order to achieve high levels of overlay accuracy. Unfortunately, alignment precision is usually lost whenever wafers are moved within conventional lithography systems with robots.

What is needed is a system and method for handling wafers within a lithography system that both avoids the loss of alignment caused by conventional robots, while at the same time improving system throughput.

SUMMARY OF THE INVENTION

In one embodiment, the present invention includes a lithography system having a lithography patterning chamber, a wafer exchange chamber separated from the lithography patterning chamber by a first gate valve, and at least one alignment load-lock separated from the wafer exchange chamber by a second gate valve. The alignment load-lock includes an alignment stage that aligns a wafer during pump-down. An alignment load-lock according to the present invention can be uni-directional or bi-directional. Likewise, a lithography system according to the present invention can include one or multiple alignment load-locks.

A lithography system according to the present invention can also include a holding load-lock separated from the wafer exchange chamber.

A lithography system according to the present invention can further include an illumination source that emits light having an inspection wavelength, and a camera sensitive to said inspection wavelength. A roof of the alignment load-lock is transparent to the inspection wavelength to allow observation of the wafer contained within the alignment load-lock.

Also included within the alignment load lock according to an embodiment of the present invention are supports for holding a wafer. These supports can be hooks, pins, and the like. An alignment stage is further located within the alignment load lock. The alignment stage is separated from an alignment sub-stage disposed outside of the alignment load-lock by a column extending through a floor of the alignment load-lock. Furthermore, the floor of the alignment load-lock can include a motion feedthrough seal that allows the column to move relative to the floor while preventing gas flow into the alignment load-lock. Such a motion feedthrough seal can include bellows and rotary seals such as ferromagnetic seals.

Further included in an embodiment of the present invention are multiple chucks. The chucks can be electrostatic chucks or vacuum chucks. The chucks can include cutouts for accommodating the wafer supports within the alignment load-lock. The chucks can further include chuck engagement mechanisms for kinematically mounting the chucks to the alignment stage or to a stage located within the lithography patterning chamber. In critical areas, the chuck engagement mechanisms can be kinematic hemispheres in order to avoid stress and strain, including, for example, hemispheres for engagement with vee-blocks located on the various stages within the lithography system.

In an embodiment of the present invention, the lithography patterning chamber can include multiple exposure stages.

Also disclosed is a method of patterning a wafer within a lithography system. In an embodiment, the method includes a first step of placing the wafer on supports within an alignment load-lock. In a next step, the wafer is aligned with respect to a chuck while the wafer is supported within the alignment load-lock on the supports. In another step, the wafer is secured to the chuck. And in yet another step, pump-down is performed to create a vacuum within the alignment load-lock.

In a method according to the present invention, pump-down can be performed concurrently with aligning the wafer relative to the chuck. Likewise, pump-down can be performed concurrently with securing the wafer to the chuck subsequent to the alignment step.

A method according to an embodiment of the present invention can also include a step of transporting the chuck and wafer to a lithography patterning chamber. Further fine alignment may be needed in the lithography patterning chamber. Next, a step of performing lithography patterning on the wafer is conducted. Once the lithography patterning is complete, the wafer and chuck are returned to the alignment load-lock area. Once back at the alignment load-lock, the chuck can be removed from the wafer and venting can be performed. The venting can take place while the wafer is being removed from the chuck.

Also disclosed herein is a method of aligning a wafer within an alignment load-lock. In an embodiment, this method includes a first step of placing the wafer on supports within the alignment load-lock. Next, a step of observing the location and orientation of the wafer on the supports within the alignment load-lock is performed. Also performed is a step of moving a chuck so as to align the wafer with respect to the chuck. Once aligned, the chuck is then placed in contact with, and secured to, the wafer. The step of observing the location and orientation of the wafer can be performed by a camera located outside of the alignment load-lock.

BRIEF DESCRIPTION OF THE FIGURES

The accompanying drawings, which are incorporated herein and form part of the specification, are illustrations of the present invention and, together with the description, further serve to explain the principles of the invention and to enable a person skilled in the pertinent art to make and use the invention. Like reference numbers refer to like elements within the different FIGs.

DETAILED DESCRIPTION OF THE PREFERRED EMBODIMENTS

As used herein, the term wafer means a semiconductor wafer, or any other substrate suitable for lithographic patterning.

Alignment, pump-down, and charging of an electrostatic chuck are all procedures that take up precious time within a lithography patterning process. The present inventors have discovered that all three of these functions can be combined into a single alignment load-lock station. Such a single alignment load-lock station can align a wafer with respect to a chuck and then secure that wafer to the chuck, all the while pumping-down the load-lock. By including more than one chuck within such a lithography system, wafers can be secured to their respective chucks during lithography patterning, thereby maximizing throughput.

Figure 1:
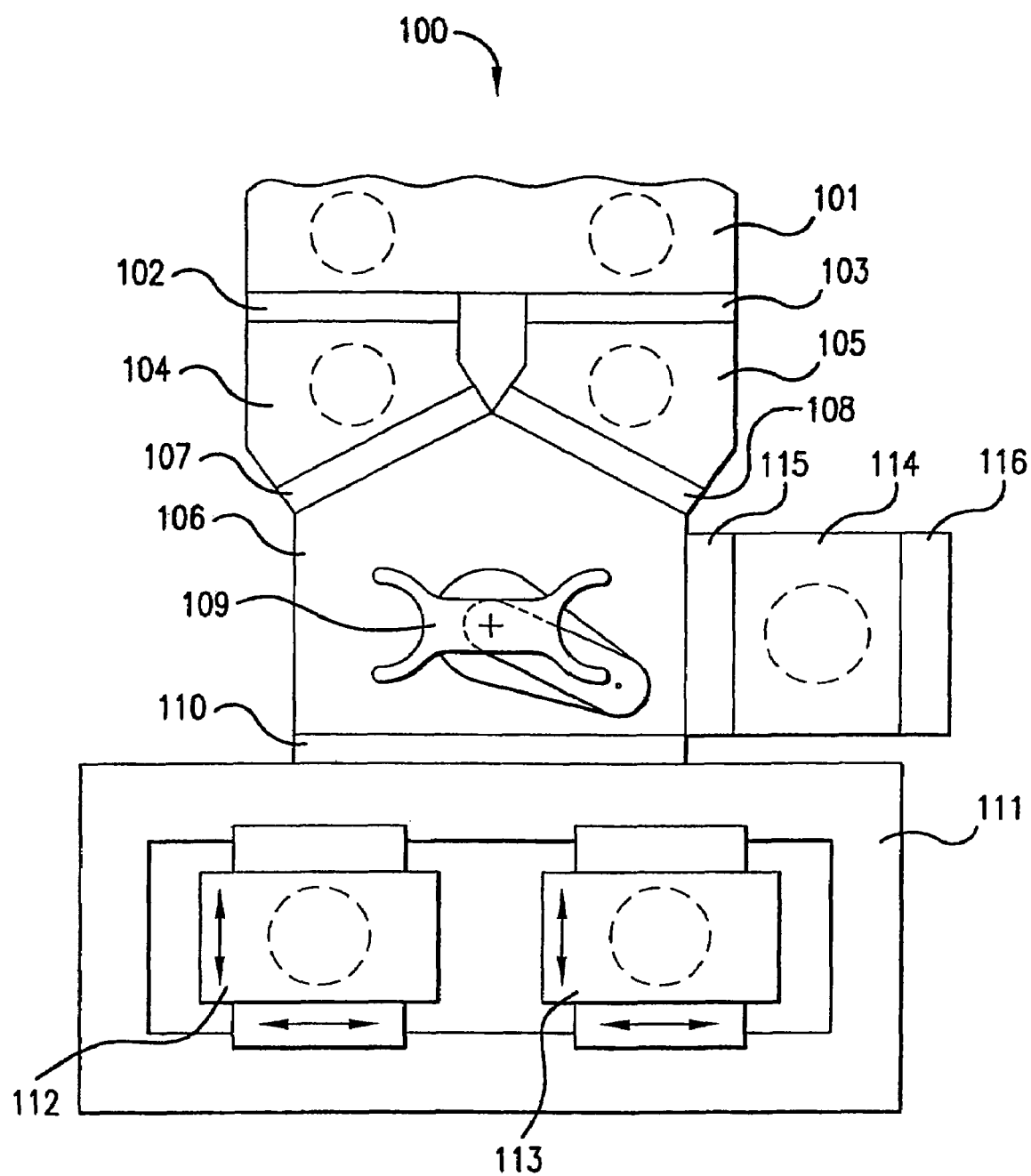
FIG. 1 is an illustration of a lithography system according to the present invention.

FIG. 1 is an illustration of a lithography system 100 according to the present invention. Lithography system 100 patterns wafers, indicated by dashed circles within the FIG., that are obtained from a track 101. Wafers obtained from track 101 have undergone various processes as required prior to lithography patterning. For example, resist-apply, pre-bake, and other processes known to those skilled in the relevant art(s) are conducted on wafers prior to lithography patterning. After lithography patterning, wafers are returned to the track for further processing steps, such as development, post bake, and the like. Track 101 is connected to lithography system 100 via two gate valves 102, 103. Gate valves 102, 103 are of the type known to those skilled in the relevant art(s) as being capable of maintaining different atmospheric pressures on either side of the gate valve. Gate valves 102, 103 separate track 101 from two alignment load-locks 104, 105.

Alignment load-locks 104, 105 are separated from a wafer exchange chamber 106 by gate valves 107, 108. Gate valves 107, 108 are analogous to gate valves 102, 103 that connect alignment load-locks 104, 105 to the track 101. Each alignment load-lock 104, 105 is thus a chamber separated from track 101 and wafer exchange chamber 106 by respective gate valves. Alignment load-locks 104, 105 are further connected to vacuum and venting elements (not shown) that allow the alignment load-locks to be transitioned from atmospheric pressure to vacuum (pumped-down) and back to atmospheric pressure again (vented). In this way, wafer exchange chamber 106 can be held at a high vacuum while track 101 is held at atmospheric pressure. Alignment load-locks 104, 105 thus serve to move wafers in and out of the wafer exchange chamber while transitioning from atmospheric pressure to high vacuum. The present inventors have discovered that by including alignment and chucking features within alignment load-locks 104, 105, overall system throughput can be greatly enhanced. Alignment load-locks 104, 105 will be discussed in greater detail below in connection with FIGS. 2a and 2b.

Wafer exchange chamber 106 includes a robot 109 having a dual end-effector. Robot 109 is vacuum compatible and is capable of handling two chucks at once by virtue of its dual end-effector. Alternatively, other structures can be used to transport the chuck with aligned wafer from the alignment load-lock to the lithography patterning chamber as would apparent to those skilled in the relevant arts given this disclosure. For example, a robot having a single end-effector, or dual, non-robotic, transport mechanisms could also be used without departing from the scope of the present invention.

Wafer exchange chamber 106 is connected to lithography patterning chamber 111 by gate valve 110. Gate valve 110 is similar to the other gate valves described herein. Lithography patterning chamber 111 includes wafer stages 112, 113. Wafer stages 112, 113 are capable of movement in the directions indicated for fine alignment and exposure processes. Lithography patterning chamber 111 thus further includes projection optics or other elements necessary to perform the lithography patterning. While lithography patterning chamber 111 includes two wafer stages 112, 113 a lithography patterning chamber could also include one wafer stage. A dual wafer stage structure like that shown is described in more detail in co-pending, commonly owned U.S. patent application Ser. No. 09/449,630, titled "Dual-Stage Lithography Apparatus and Method," filed Nov. 30, 1999, which is hereby incorporated by reference in its entirety.

Lithography system 100 further includes a holding load-lock 114. Holding load-lock 114 is used to hold a spare chuck, or to exchange chucks within the lithography system while maintaining lithography patterning. This allows access to a chuck held in holding load-lock for cleaning, for example. Holding load-lock 114 also includes gate valves 115 and 116. While the presence of holding load-lock is preferable, as it allows chuck exchange without stopping lithography patterning, it can be omitted without departing from the scope of the present invention.

While alignment load-locks 104, 105, and holding load-lock 114 are all preferably bi-directional load-locks, uni-directional load-locks could also be used without departing from the scope of the present invention. Unidirectional load-locks are capable of wafer input or wafer output only. Bidirectional load-locks, however, are capable of both wafer input and wafer output.

For example, if the wafer is transferred from track 101 to a unidirectional alignment load-lock and then to patterning chamber 111, it cannot then be transferred to the same unidirectional alignment load-lock after it has been patterned. Rather, after the patterning process is completed in the lithography patterning chamber, the wafer must instead be returned to another alignment load-lock and then, in turn, to track 101.

By contrast, if the wafer is transferred from track 101 to a bidirectional alignment load-lock and then to lithography patterning chamber 111, after patterning, the wafer can be transferred back through the same bidirectional alignment load-lock to track 101.

While the use of two bi-directional alignment load-locks is advantageous as it allows for greater system throughput, two single unidirectional load-locks could also be used. Likewise, a single bi-directional alignment load-lock could also be used without departing from the scope of the present invention. The precise structure and function of each of alignment load-locks 104, 105 will now be described in connection with FIGS. 2A and 2B.

Figure 2A:
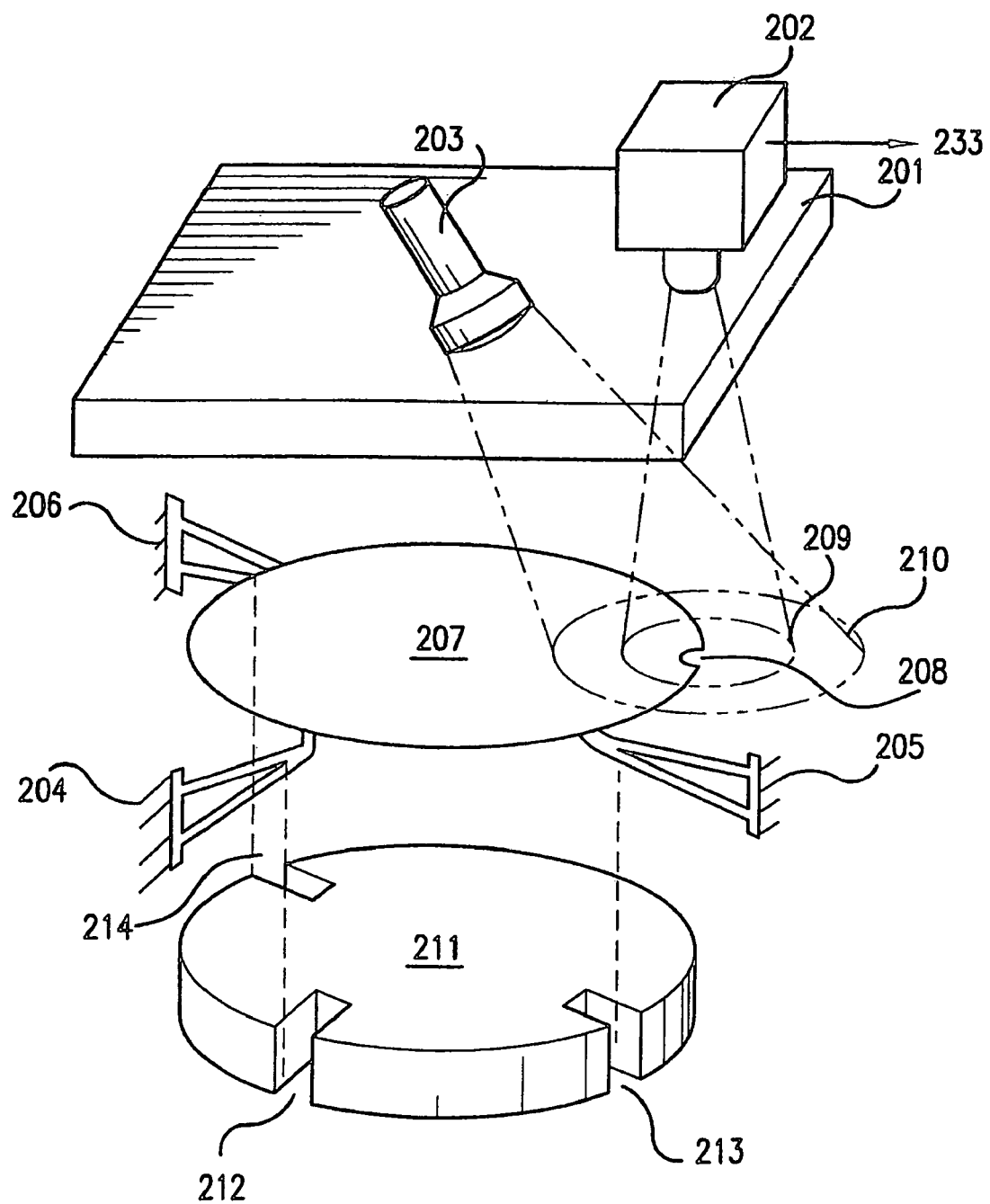
FIG. 2A is an exploded view of the upper elements within an alignment load-lock according to the present invention.
Figure 2B:
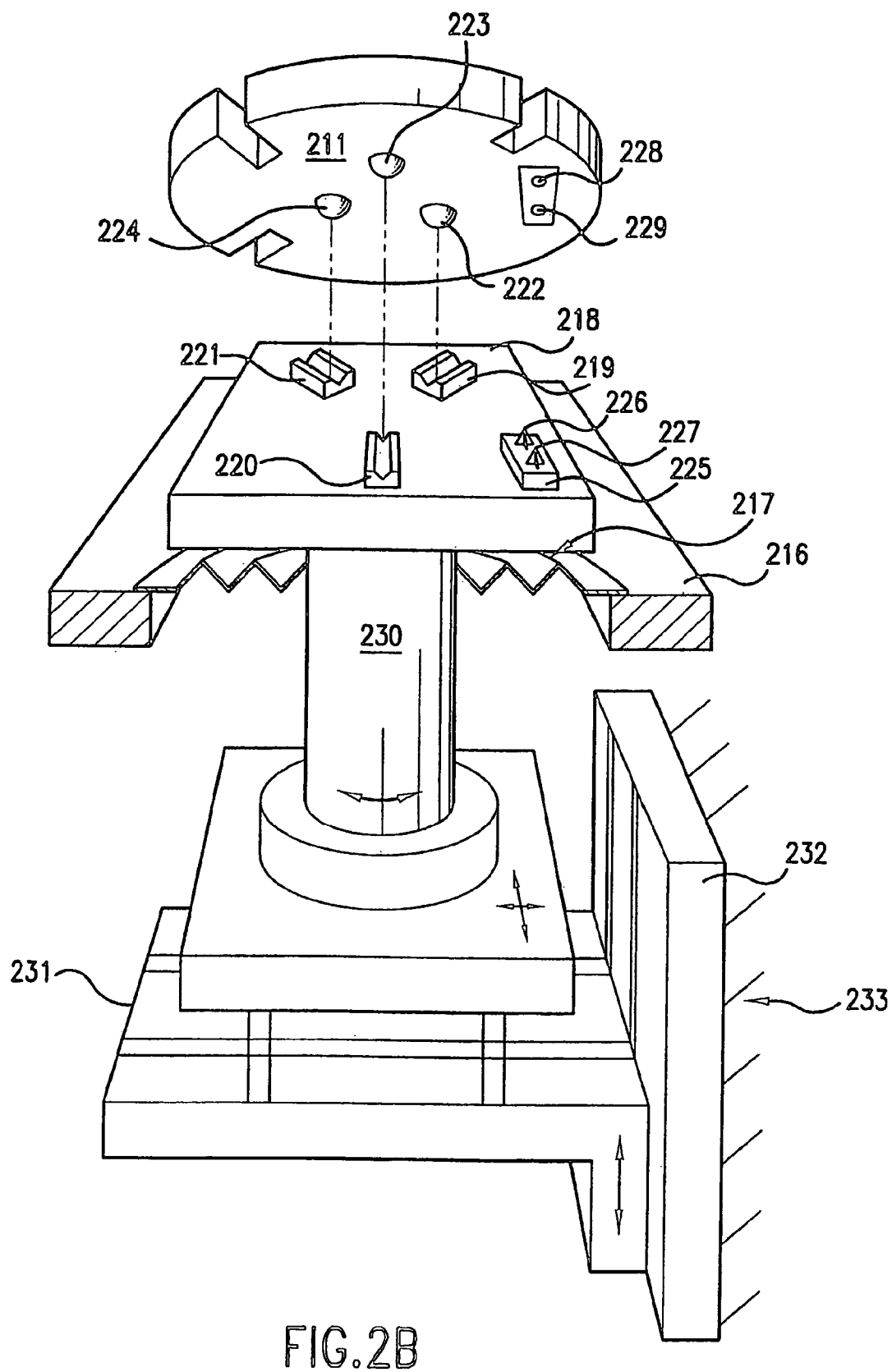
FIG. 2B is an exploded view of the lower elements within an alignment load-lock according to the present invention.

FIGS. 2A and 2B together constitute an exploded view of the elements within an alignment load-lock according to the present invention. FIG. 2A corresponds to the upper portion of an alignment load-lock according to the present invention, while FIG. 2B corresponds to the lower portion of an alignment load-lock according to the present invention. The walls of the alignment load-lock are not shown in either of FIG. 2A or 2B.

Alignment load-lock roof 201 is an airtight transparent or semi-transparent window. A camera 202 and an illumination source 203 are disposed above alignment load-lock roof 201. By "semi-transparent," it is meant that alignment load-lock roof 201 is at least transparent to an inspection wavelength of light emitted from illumination source 203 to which camera 202 is sensitive. Within the alignment load-lock are wafer supports 204, 205, 206. These wafer supports 204–206 are used to hold a wafer 207. Wafer supports 204–206 are illustrated in the FIG. as hooks, but could also comprise pins, or other supporting mechanisms, as would be apparent to one skilled in the relevant art(s). Wafer 207 has been placed on wafer supports 204–206 from track 101 by an additional robot, which is customarily part of the track system (not shown). Moreover, wafer 207 can undergo prior coarse alignment so that notch 208 or other desired feature is placed within a field of view 209 of the camera 202, which is within an illumination field 210 of the illumination source 203. Such prior coarse alignment can be accomplished in a manner known to those skilled in the relevant art(s). For example, it can be performed by a module in the track that spins the wafer and locates the notch using a photoelectric sensor. Also included within the alignment load-lock shown is a chuck 211 having chuck cutouts 212, 213, and 214. Chuck cutouts 212–214 are large enough to accommodate a range of motion if the chuck such that wafer supports 204–206 can be accommodated within these chuck cutouts 212–214. Thus, chuck cutouts 212–214 line up approximately with wafer supports 204–206.

FIG. 2B corresponds to the bottom portion of the alignment load-lock. Specifically, alignment load-lock floor 216 having a motion feedthrough seal 217 is located at a bottom portion of the alignment load-lock. Motion feedthrough seal 217 allows movement of a column 230, upon which is disposed an alignment stage 218, with respect to the load-lock floor while preventing gas from flowing into the load lock. In the particular embodiment shown, motion feedthrough seal 217 comprises bellows that will be described below in greater detail with respect to FIG. 3. Alternatively, other types of motion feedthrough seals, such as a movable seal or a ferrofluidic seal, could be used without departing from the scope of the present invention.

Alignment stage 218 include stage engagement mechanisms 219, 220, and 221. Stage engagement mechanisms are used for kinematically mounting the chuck 211 with chuck engagement mechanisms 222–224 disposed on the lower surface of the chuck 211. In critical areas, the chuck engagement mechanisms can be kinematic hemispheres in order to avoid stress and strain, including, for example, hemispheres for engagement with vee-blocks 219–221 located on the various stages within the lithography system. In the embodiment shown, stage engagement mechanisms 219–221 comprise vee-blocks 219–221 that constitute the bottom half of a kinematic mount. Likewise, in the embodiment shown, chuck engagement mechanisms 222–224 comprise hemispheres that constitute the top half of the kinematic mount. As would be apparent to one skilled in the relevant art(s) given this description, other types of kinematic mounts can be used without departing from the scope of the present invention.

In the embodiment shown, chuck 211 is an electrostatic chuck capable of maintaining an electric charge sufficient to hold a wafer for an extended period of time. In one embodiment, however, chuck 211 is a vacuum chuck. Alignment stage 218 further includes contact block 225, having pogo contacts 226 and 227. Pogo contacts 226, 227 are used to make electrical contact with contact pads 228 and 229 disposed on the bottom of chuck 211. In one embodiment, pogo contacts 226 and 227 are spring-loaded contacts made of metal tubing. The metal tubing comprises a spring with a metal bar. The metal bar contacts the contact pads 228 and 229. Chuck 211 is charged and discharged through contact pads 228 and 229 when connected to pogo contacts 226 and 227. While the present invention is described in terms of an electrostatic chuck, other chucks can be used without departing from the scope of the present invention. For example, vacuum chucks, mechanical clamping, and other means of securing a wafer to a chuck could be used, as would be apparent to one skilled in the relevant art(s). Due to the high vacuum environment in which extreme ultraviolet light processing occurs, electrostatic chucks are preferable.

Alignment stage 218 is positioned at the top of column 230. Column 230 is disposed atop an alignment substage 231, which is held by an alignment substage mount 232. Additional motor and control elements (not shown) are used to move the alignment stage in four degrees of freedom (rotation, two horizontal translations, and a vertical translation) and as indicated by the arrows in the FIG., as would be apparent to a person skilled in the relevant art(s), given this description. Motion feedthrough seal 217 serves to separate the high vacuum environment within the alignment load-lock from the alignment substage 231, alignment substage mount 232, and the remainder of the lithography system.

Operation of the elements within the alignment load-lock will now be described. It should be noted that chuck 211 and wafer 207 are not integral parts of the alignment load-lock. Rather, chuck 211 is one of a number of like chucks which are used within the lithography system 100. Likewise, wafer 207 has been obtained from track 101 for lithography patterning within lithography patterning chamber 111, of the system shown in FIG. 1. As mentioned above, wafer 207 may have undergone coarse alignment prior to being placed on wafer supports 204–206. This coarse alignment can be performed in order to place notch 208 within the field of view 209 of camera 202. Since camera 202 can see notch 208, the camera 202 can determine both the center of the wafer from the radius of curvature visible within the field of view 209 as well as the orientation of the wafer from the location of notch 208. In this respect, it should be noted that while one camera 202 has been shown in FIG. 2A, a plurality of such cameras and light sources 203 can be used without departing from the scope of the present invention. Since camera 202 is used for determining notch location 208 as well as the radius of curvature of wafer 206, the use of more than one camera can increase the precision of the observations, as would be apparent to one skilled in the relevant art(s) given this disclosure. Best results would be obtained with two diametrically opposed cameras (or equally spaced cameras, in reference to the wafer).

Camera 202 looks at field of view 209 to determine wafer location 207. This wafer location is then output by camera 202 to a pattern recognition unit 233 (not shown). The pattern recognition unit sends location information to alignment substage 232. Since the pattern recognition unit knows the precise orientation and location of wafer 207 it can control the location of alignment stage 218 through alignment substage 231 and alignment substage mount 232. Once chuck 211 has been aligned with wafer 207, chuck 211 is moved up to and put in contact with wafer 207. Once in contact with wafer 207, chuck 211 is charged through contact pads 228 and 229, which are in contact with pogo contacts 226 and 227 at contact block 225 of alignment stage 218. Since chuck 211 has been aligned with wafer 207 prior to chuck 211 being charged, wafer 207 is firmly held in contact with chuck 211 by virtue of the charge. Since each wafer stage 112, 113 within lithography patterning chamber 111 includes kinematic mounts, the repeatability of chuck placement on wafer stages 112, 113 within the lithography patterning chamber is limited to the accuracy of the kinematic mounts. The kinematic mounts shown, which use vee-blocks and hemispheres, have a repeatability of about two microns. Since chuck 211 can maintain its electrostatic charge within the lithography system 100, the alignment of a wafer, for example, wafer 207, will always be within the repeatability of the kinematic mounts used.

Returning to FIG. 1, it should be apparent from the above discussion in connection with FIGS. 2A and 2B that while a wafer is within either of alignment load-locks 104 or 105, alignment and chucking operations can be performed while the alignment load-lock is undergoing pump-down. Once a wafer within alignment load-lock 104 or alignment load-lock 105 has been aligned with respect to a chuck and attached to that chuck, and pumpdown is complete, the gate valve 107, or 108, can be opened, at which point robot 109 can lift the chuck and wafer together from within either alignment load-lock and move it to the lithography patterning chamber 111. Since robot 109 includes a gripper, it can hold two chucks at once. Thus, robot 109 can swiftly exchange chucks between either alignment load-lock station and either wafer stage.

Figure 3A:
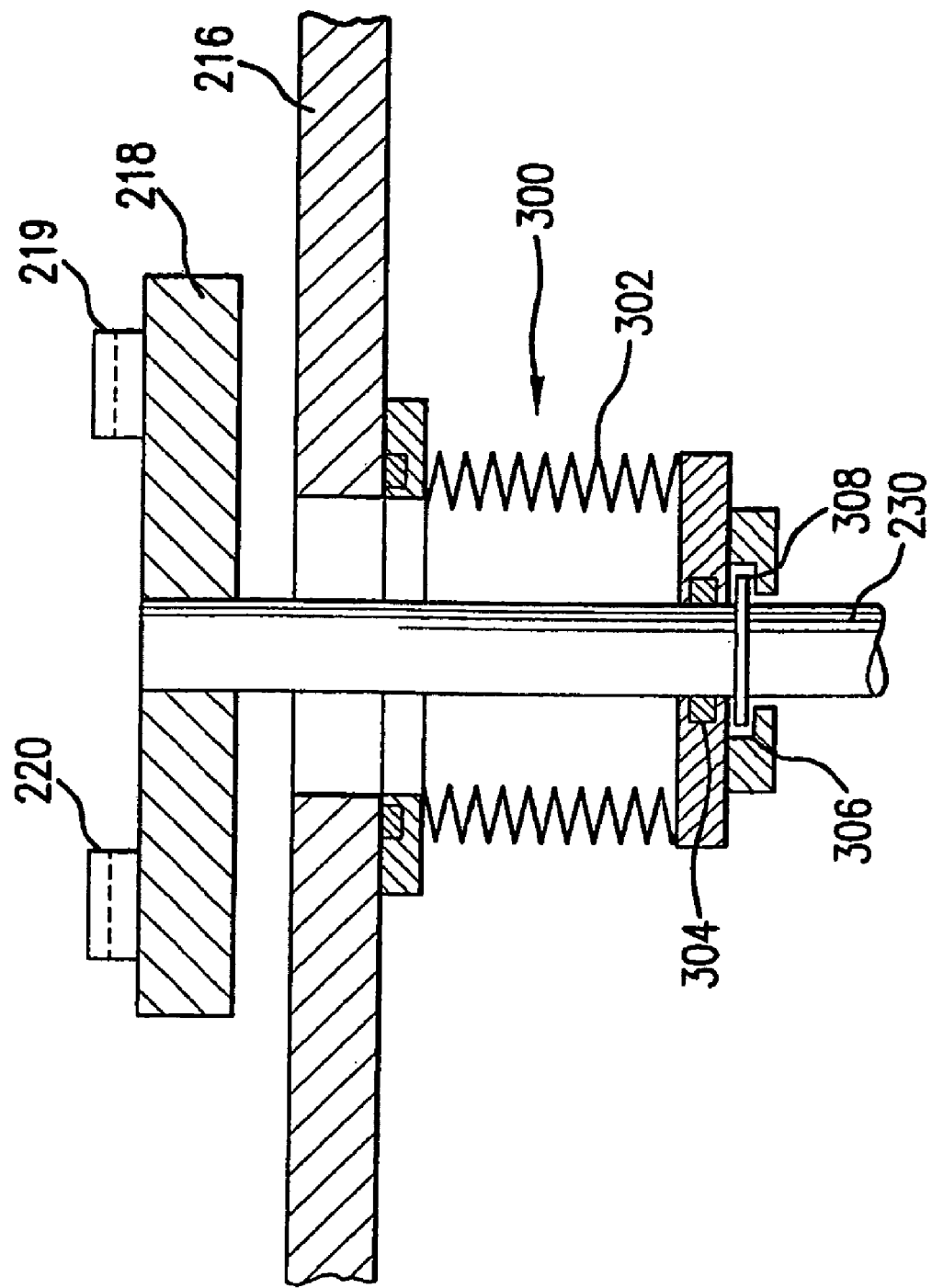
FIG. 3A is an illustration of a floor-mounted motion feedthrough 300 within a lithography system according to the present invention.

FIG. 3A is an illustration of a floor-mounted motion feedthrough 300 within a lithography system of the present invention. Bellows 302 allow vertical and horizontal translations of shaft 230 relative to load-lock floor 216, while maintaining vacuum inside the load lock. Bellows 302 include a plurality of metal, preferably stainless steel disks welded at their peripheral and inside edges. These bellows allow column 230 to move in six degrees of freedom while maintaining a vacuum seal. Rotary seal 304 allows rotation of shaft 230, while maintaining a vacuum. Bearing 306 captures shaft flange 308, preventing collapse of the bellows due to atmospheric pressure. It will be apparent to one skilled in the art that seal 304 can be an elastomer seal, a pre-loaded teflon seal, or a ferrofluidic seal. It will also be apparent that the transfer of rotary motion accomplished by 304–308 could have also been accomplished via a magnetic coupling.

Figure 3B:
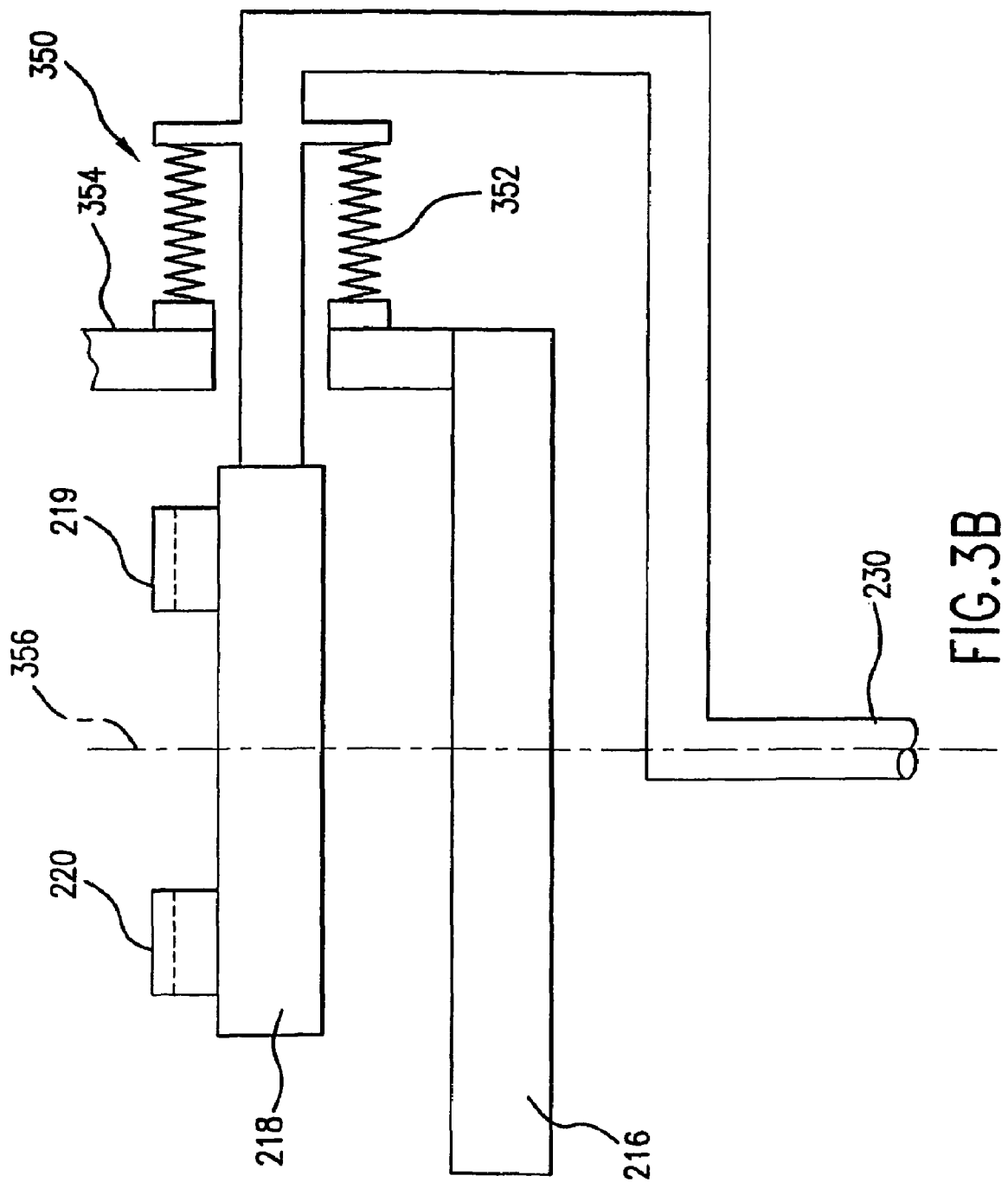
FIG. 3B is an illustration of a wall-mounted motion feedthrough 350 within a lithography system according to the present invention.

FIG. 3B is an illustration of a wall-mounted motion feedthrough 350 within a lithography system of the present invention. Bellows 352, attached to chamber wall 354, allows vertical and horizontal translation of alignment stage 218. Bellows 352 also allow a limited amount of rotation of alignment stage 218 about its centerline 356. This arrangement does not require a rotary seal, and is, therefore, less leak-prone than the apparatus of FIG. 3A. However, whereas the rotary seal 304 of FIG. 3A allows unlimited rotation, the bellows 352 only allow a few degrees of rotational freedom. The limited amount of rotation is sufficient if a coarse alignment step is performed on the wafer (by the track) before introducing the wafer in the load-lock. It will be understood that a second wall-mounted feedthrough mechanism could be added diametrically opposite to the one shown through a hole in an opposite wall in order to improve mechanical stability of the apparatus, without deviating from the present invention.

Figure 4A:
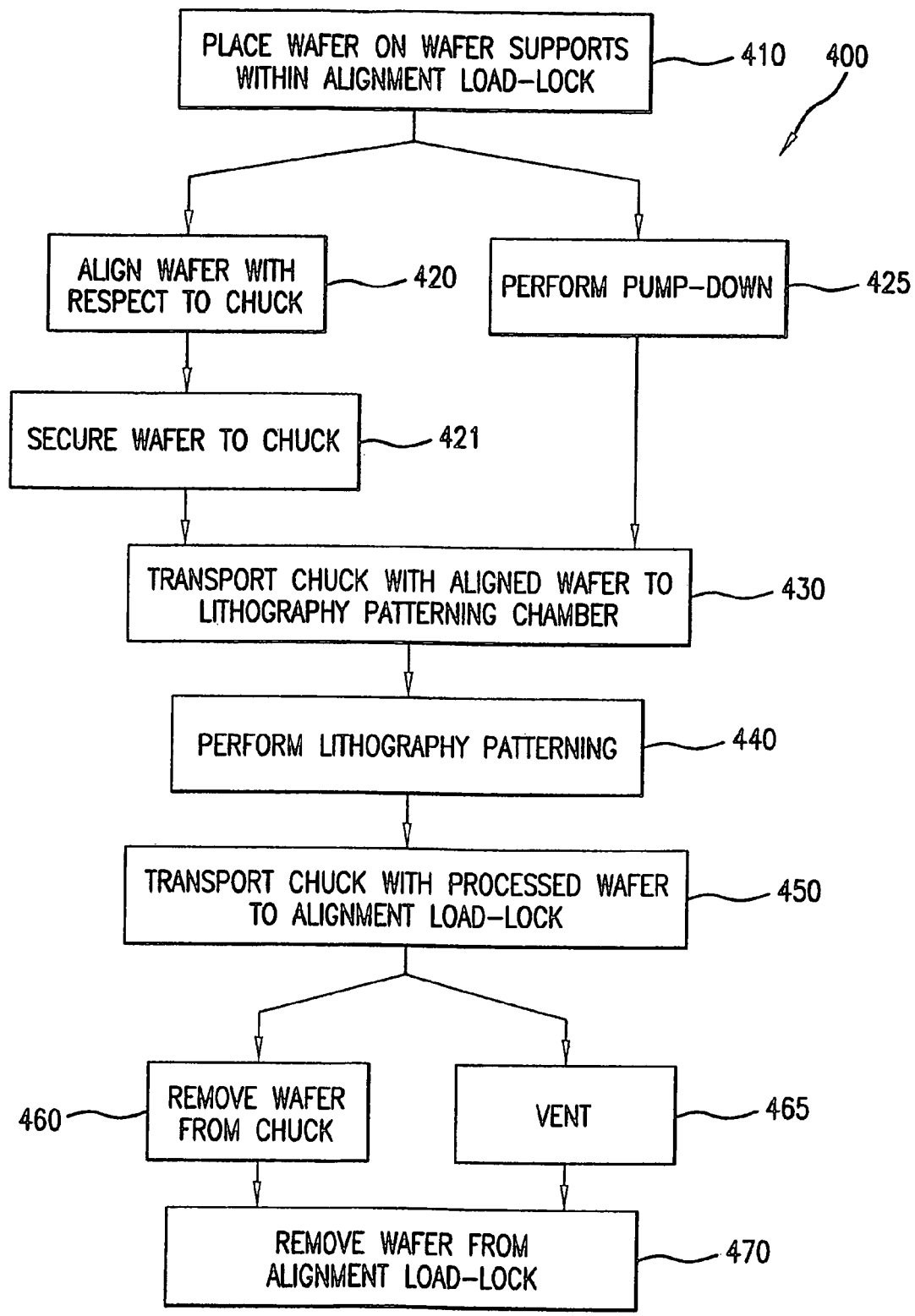
FIG. 4A is an illustration of a method of patterning a wafer within a lithography system utilizing a bidirectional load-lock(s) according to the present invention.

FIG. 4A is an illustration of a method 400 of patterning a wafer within a lithography system utilizing at least one bidirectional alignment load-lock according to the present invention. It should be noted that such a system can comprise only one bidirectional alignment load-lock or a plurality of bidirectional alignment load-locks to increase efficiency and throughput. In the embodiment utilizing a bidirectional alignment load-lock system, unlike the embodiment utilizing a unidirectional alignment load-lock system, the bidirectional alignment load-lock(s) is capable of accepting the wafer from track 101 as it enters the lithography system (input) and also allowing the wafer to enter it after patterning and be dispelled from it back to track 101 (output). In other words, the wafer can be transferred from track 101 to the bidirectional alignment load-lock, from the bidirectional alignment load-lock to the patterning chamber, from the patterning chamber after patterning to the same bidirectional alignment load-lock, and then from the bidirectional alignment load-lock to the track 101.

In a first step 410 of the method 400 of FIG. 4A, a wafer is placed on wafer supports within a bidirectional alignment load-lock(s). As described above in connection with FIG. 1, the wafer can be taken from a track before being placed onto supports within the bidirectional alignment load-lock(s). Placing the wafer on the supports within the bidirectional alignment load-lock(s) can be accomplished with, for example, a robot. As described above in connection with FIG. 2A, the wafer supports within the bidirectional alignment load-lock(s) can comprise hooks, pins, and the like. Also, as described above in connection with FIG. 1, the bidirectional alignment load-lock(s) can comprise a conventional load-lock chamber with gate valves separating a track from a wafer transport chamber. In a lithography system operating at high vacuum, such a wafer transport chamber would be kept at high vacuum while the track would be kept at atmospheric pressure. The bidirectional alignment load-lock(s) is thus used to transfer wafers in and out of the high vacuum environment within the lithography apparatus itself without exposing the entire apparatus to atmospheric pressure.

In a next step 420, the wafer is aligned with respect to a chuck. As described elsewhere herein, the chuck can be an electrostatic chuck, a vacuum chuck, or a chuck with other mechanical clamping features. In a next step 421, the aligned wafer is secured to the chuck. The securing of the aligned wafer to the chuck 421 can be accomplished by moving the chuck up to and in contact with the wafer and then, in the case of an electrostatic chuck, charging the electrostatic chuck to thereby secure the wafer to the chuck. Such charging can be accomplished through the use of pogo contacts on an alignment stage which are in contact with pads on the bottom surface of the electrostatic chuck. Further details of steps 420 and 421 are described in greater detail below in connection with FIG. 5.

In a step 425, concurrent with at least one or both of steps 420 and 421, a pump-down is performed within the bidirectional alignment load-lock(s). As is known to those skilled in the relevant art(s), pump-down is the procedure whereby the load-lock is evacuated of gases thus bringing it from atmospheric pressure to high vacuum. As described elsewhere herein, the present inventors have discovered that by performing the pump-down operation simultaneously with the alignment of the wafer with respect to the chuck and the securing of the wafer to the chuck, greater throughput can be realized within a lithography system according to the present invention.

In a next step 430, the chuck with the aligned wafer is transported to a lithography patterning chamber. As described above in connection with FIG. 1, the transportation of the chuck from the bidirectional alignment load-lock(s) to the lithography patterning chamber can be accomplished by a robot located within a wafer exchange chamber disposed between the bidirectional alignment load-lock(s) and the lithography patterning chamber. Such a robot can have a dual end defector to realize greater efficiency of transportation of chucks between bidirectional alignment load-lock(s) and the lithography patterning chamber. Alternatively, other structures can be used to transport the chuck with aligned wafer from the bidirectional alignment load-lock(s) to the lithography patterning chamber, as would apparent to those skilled in the relevant art(s) given this disclosure. For instance, the chuck and wafer could be placed on a kinematic mount of the exposure stage.

Once the chuck with aligned wafer have been placed into the lithography patterning chamber, lithography patterning is performed in a next step 440. Such lithography patterning can include a final alignment step as well as additional steps used within lithography patterning as are known to those skilled in the relevant art(s).

In a next step 450, the chuck with processed wafer are removed from the kinematic mount of the exposure stage to a bidirectional alignment load-lock(s) from the lithography patterning chamber. As described above in connection with step 430, the transportation of the chuck with the processed wafer from the lithography patterning chamber to the bidirectional alignment load-lock(s) can be performed with a robot located within a wafer exchange chamber. Moreover, the chuck with patterned wafer can be brought back to the same bidirectional alignment load-lock(s) through which it entered the system.

In a next step 460, the processed wafer is removed from the chuck within the bidirectional alignment load-lock(s). This step is substantially the reverse of process step 421, discussed above. Thus, once the chuck with patterned wafer is returned to the bidirectional alignment load-lock(s), the chuck can be discharged. Once discharged, the chuck can be lowered away from the wafer leaving the wafer held by the wafer supports. Concurrently with step 460, a venting operation is performed at a concurrent step 465. Venting is the process by which the pressure within the bidirectional alignment load-lock(s) is brought from high vacuum back to atmospheric pressure. As with steps 420, 421, and 425, the venting step 465 is performed simultaneously with step 460. As with the pump-down process, performing venting while removing the wafer from the chuck further increases the throughput of a lithography system according to the present invention.

In a final step 470, the now patterned wafer is removed from the bidirectional alignment load-lock(s) and placed back onto the track. Alternatively, the wafer can be placed onto another structure used to move wafers away from the lithography apparatus. As will be apparent to a person skilled in the relevant arts, after the final step 470 of the method 400 of FIG. 4 has been performed, the lithography system has been returned to its condition existing prior to the first step, 410. Accordingly, method 400 can be repeated indefinitely for the lithography patterning of multiple wafers.

Figure 4B:
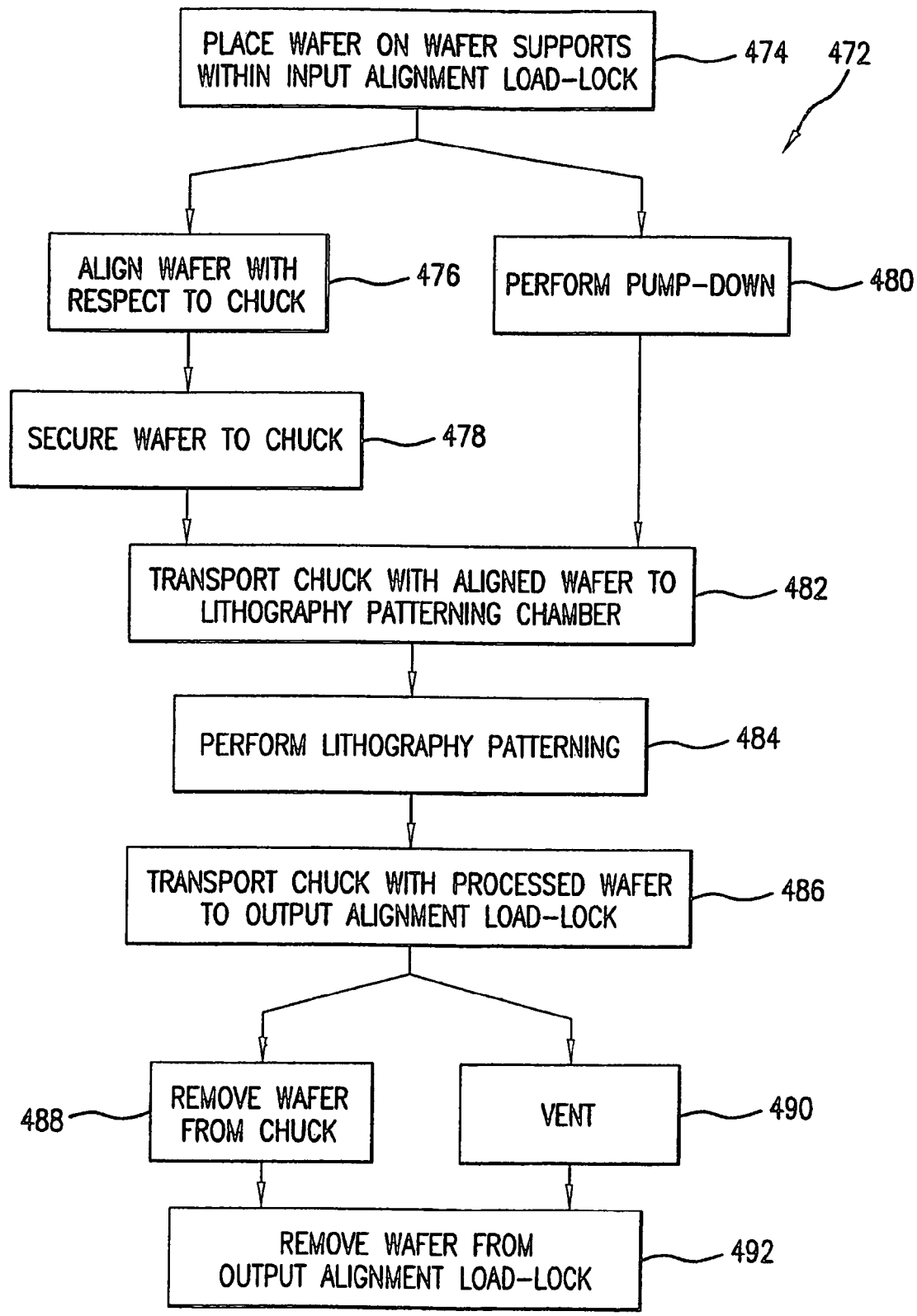
FIG. 4B is an illustration of a method of patterning a wafer within a lithography system utilizing a unidirectional load-lock(s) according to the present invention.

FIG. 4B is an illustration of a method 472 of patterning a wafer within a lithography system utilizing unidirectional alignment load-lock(s) according to the present invention. In a first step 474 of the method 472 of FIG. 4B, a wafer is placed on wafer supports within an input alignment load-lock. The input alignment load-lock is unidirectional, as the wafer does not exit the system through the same alignment load-lock through which it entered the system. Rather, it is returned to another alignment load-lock (output alignment load-lock) after it undergoes patterning in the patterning chamber and exits the system (i.e., transferred to track 101) through the output alignment load-lock. As described above in connection with FIG. 1, the wafer can be taken from a track before being placed onto supports within the input alignment load-lock. Placing the wafer on the supports within the input alignment load-lock can be accomplished with, for example, a robot.

As described above in connection with FIG. 2A, the wafer supports within the input alignment load-lock can comprise hooks, pins, and the like. Also, as described above in connection with FIG. 1, the input alignment load-lock can comprise a conventional input load-lock chamber with gate valves separating a track from a wafer transport chamber. In a lithography system operating at high vacuum, such a wafer transport chamber would be kept at high vacuum while the track would be kept at atmospheric pressure. The input alignment load-lock is thus used to transfer wafers into the high vacuum environment within the lithography apparatus itself without exposing the entire apparatus to atmospheric pressure.

In a next step 476, the wafer is aligned with respect to a chuck. As described elsewhere herein, the chuck can be an electrostatic chuck, a vacuum chuck, or a chuck with other mechanical clamping features. In a next step 478, the aligned wafer is secured to the chuck. The securing of the aligned wafer to the chuck can be accomplished by moving the chuck up to and in contact with the wafer and then, in the case of an electrostatic chuck, charging the electrostatic chuck to thereby secure the wafer to the chuck. Such charging can be accomplished through the use of pogo contacts on an alignment stage which are in contact with pads on the bottom surface of the electrostatic chuck. Further details of steps 476 and 478 are described in greater detail below in connection with FIG. 5.

In a step 480 concurrent with at least one or both of steps 476 and 478, a pump-down is performed within the input alignment load-lock.

In a next step 482, the chuck with the aligned wafer is transported to a lithography patterning chamber. As described above in connection with FIG. 1, the transportation of the chuck from the input alignment load-lock to the lithography patterning chamber can be accomplished by a robot located within a wafer exchange chamber disposed between the input alignment load-lock and the lithography patterning chamber. Alternatively, other structures can be used to transport the chuck with aligned wafer from the input alignment load-lock to the lithography patterning chamber, as would apparent to those skilled in the relevant art(s) given this disclosure. For instance, the chuck and wafer could be placed on a kinematic mount of the exposure stage.

Once the chuck with aligned wafer have been placed into the lithography patterning chamber, lithography patterning is performed in a next step 484. Such lithography patterning can include a final alignment step as well as additional steps used within lithography patterning as are known to those skilled in the relevant art(s).

In a next step 486, the chuck with processed wafer are removed from the kinematic mount of the exposure stage to an output alignment load-lock from the lithography patterning chamber. It should be noted that the output alignment load-lock is not the same alignment load-lock as the input alignment load-lock. The wafer is only transferred through the output alignment load-lock after it has exited the lithography patterning chamber and needs to be transferred back to track 101. As described above in connection with step 482, the transportation of the chuck with the processed wafer from the lithography patterning chamber to the output alignment load-lock can be performed with a robot located within a wafer exchange chamber.

In a next step 488, the processed wafer is removed from the chuck within the output alignment load-lock. This step is substantially the reverse of process step 478, discussed above. Thus, once the chuck with processed wafer is transferred to the output alignment load-lock, the chuck can be discharged. Once discharged, the chuck can be lowered away from the wafer leaving the wafer held by the wafer supports. Concurrently with step 488, a venting operation is performed at a concurrent step 490. As with steps 476, 478, and 480, the venting step 480 is performed simultaneously with step 476.

In a final step 492, the now processed wafer is removed from the output alignment load-lock and placed back onto the track. Alternatively, the wafer can be placed onto another structure used to move wafers away from the lithography apparatus. As would be apparent to a person skilled in the relevant arts, after the final step 492 of the method 472 of FIG. 4B has been performed, the lithography system has been returned to its condition existing prior to the first step, 474. Accordingly, method 472 can be repeated indefinitely for the lithography patterning of multiple wafers.

Figure 5:
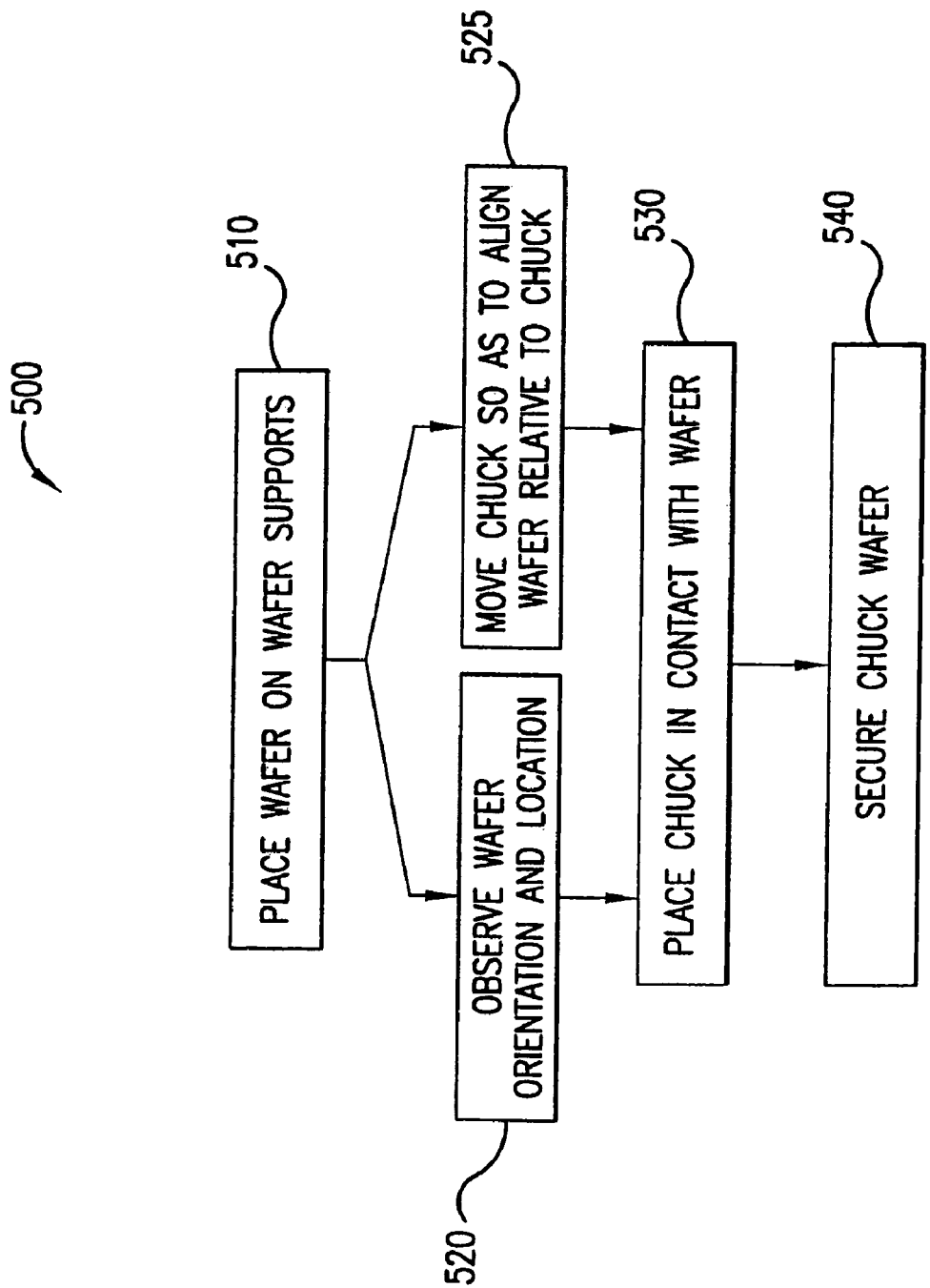
FIG. 5 is an illustration of a method of aligning a wafer within an alignment load-lock according to the present invention.

FIG. 5 is an illustration of a method 500 of aligning a wafer within an alignment load-lock according to the present invention. In a first step 510, a wafer is placed on wafer supports. As discussed elsewhere herein, such wafer supports can include hooks, pins, and the like. Also as discussed elsewhere herein, the wafer can be placed on the wafer supports through the use of a robot or other wafer transport mechanisms, as would be apparent to one skilled in the relevant art(s).

In a next step 520, the wafer's orientation and location is observed. Such observation can be conducted, for example, with a camera and illumination source located outside of the alignment load-lock, as described above in connection with FIG. 2A. The wafer's location is observed by the camera by analyzing the wafer's radius of curvature observed within the camera's field of view. The term location as used herein in connection with a wafer means the location of the wafer within an XY plane. Thus, by viewing the radius of curvature of the wafer, the location of the center of the wafer can be determined with a pattern recognition unit. Such pattern recognition units and their operation in connection with a camera and illumination source like the type described herein are well known to those skilled in the relevant art(s).

The wafer's particular orientation (i.e. its angular orientation about its center) is determined by noting the location of a notch within the wafer that is also located within the camera's field of view. In order to assure that the notch is located within the camera's field of view upon initial observation, coarse alignment can take place prior to the method shown in FIG. 5. Such coarse alignment can include, for example, the use of a wafer spinning module with an edge sensor which can be located inside the track. Such a coarse pre-alignment technique is known to those skilled in the relevant art(s) and so will not be discussed more fully herein. While the observation of wafer location and orientation has been described in terms of a single camera, multiple cameras with narrow fields of view can be used to enhance the accuracy of the alignment. By using multiple cameras directed at different viewpoints along the circumference of the wafer, the location of the center and the orientation of the notch can be more precisely determined than by using a single camera.

In a step 525, which can be performed concurrently with step 520, a chuck is moved so as to align the wafer relative to the chuck. As described elsewhere herein, such a chuck can be an electrostatic chuck, a vacuum chuck, and the like. The chuck is moved relative to the wafer through the use of an alignment stage like that described in connection with FIG. 2B. Movements of the alignment stage are controlled by the same pattern recognition unit that receives data from the camera used to observe the wafer. The pattern recognition unit knows the precise location of the wafer. The pattern recognition unit also knows the precise location of the alignment stage by virtue of location feedback from the alignment stage. By direct observation of the chuck with the camera, the pattern recognition unit can cause the alignment stage to move the chuck relative to the wafer until the wafer is aligned relative to the chuck (the diameter of the chuck is purposely a little larger than the diameter of the wafer).

Once the chuck and wafer are aligned relative to one another, a subsequent step 530 of placing the chuck in contact with the wafer is performed. This can be accomplished, for example, by moving the chuck upwards until it is in physical contact with the wafer's bottom surface. As described above in connection with FIG. 2A, the chuck can have, for example, cutouts to accommodate the wafer supports holding the wafer. Thus, when the chuck is moved upwards into contact with the wafer's bottom surface, the wafer supports will not interfere with the chuck because they are located within the chuck cutouts. Once the chuck is placed in contact with the wafer, the chuck is secured to the wafer in a next step 540. Securing the chuck to the wafer can be accomplished by charging the chuck, in the case of an electrostatic chuck. Alternatively, securing the chuck to the wafer can be performed by activating a vacuum within a vacuum chuck. Other methods of securing the chuck to the wafer can be performed without departing from the scope of the present invention.

Once the wafer has been secured to the chuck in step 540, the chuck can be moved around within a lithography system according to the present invention all the while maintaining alignment with the wafer. Since the chuck is equipped with kinematic mounting features, the alignment of the wafer relative to the exposure stage will always be within the repeatability of the kinematic mounts used within the lithography system. Typically, the repeatability of such kinematic mounts is within approximately two microns. On the other hand, the repeatability of a robot and gripper is typically a few hundred microns. Therefore, the conventional steps of performing fine alignment subsequent to robot movements can be avoided by moving wafers while attached to chucks. Fine alignment will still be needed. Performing fine alignment subsequent to robot movements, however, facilitates the fine alignment process. Thus, a lithography system according to the present invention, as described above in connection with FIG. 1, can achieve high levels of throughput, for example 120 wafers per hour, by using multiple chucks within the system.

While the present invention has been described in terms of a lithography system working within a vacuum, the present invention could be implemented as a non-vacuum system without departing from the scope of the present invention. In such a system, what has been described above as an alignment load-lock could be an alignment and chucking station without the pump-down and venting characteristics of a load-lock. Moreover, a method could be performed according to the present invention without the described pump-down and venting steps.

Conclusion

While various embodiments of the present invention have been described above, it should be understood that they have been presented by way of example only, and not limitation. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A method, comprising:
    (a) aligning a substrate with respect to a substrate support within a chamber;
    (b) adjusting a pressure within the chamber from a first pressure to a second pressure substantially simultaneously during step (a);
    (c) securely coupling the aligned substrate to the substrate support in the chamber; and
    (d) transporting the securely coupled and aligned substrate on the substrate support from the chamber to another chamber.

2. The method of claim 1, wherein the securely coupled and aligned substrate is transferred from the chamber to the another chamber having the second pressure via an area having the second pressure; and wherein the method further comprises:
    (e) patterning the securely coupled and aligned substrate in the another chamber.

3. The method of claim 1, further comprising:
    using a load-lock as the chamber; and
    using a patterning chamber as the another chamber.

4. The method of claim 1, wherein step (a) comprises:
    kinematically aligning the substrate support to an aligning stage;
    measuring a position of the substrate with respect to the substrate support using a camera;
    generating position signals with the camera based on the measuring step; and
    using the aligning stage to perform the aligning based on the position signals.

5. The method of claim 4, wherein the kinematically aligning comprises aligning a hemisphere on a surface of the substrate support with a vee-block on a surface of the aligning stage.

6. The method of claim 4, further comprising:
    electrically coupling the substrate support to the aligning stage.

7. The method of claim 6, wherein the electrical coupling comprises receiving a pogo contact protruding from the aligning stage in a contact pad on the substrate support.

8. The method of claim 1, further comprising using a load-lock as the chamber.

9. The method of claim 1, further comprising using a electrostatic chuck as the substrate support.

10. The method of claim 1, further comprising using a vacuum chuck as the substrate support.

11. The method of claim 1, wherein:
    step (a) further comprises aligning multiple ones of the substrate with respective multiple ones of the substrate support; and
    step (c) further comprises securely coupling the multiple ones of the aligned substrate to the respective multiple ones of the substrate support.

* * * * *